US012813169B2

(12) United States Patent
Lee et al.

(10) Patent No.: US 12,813,169 B2
(45) Date of Patent: Nov. 24, 2026

(54) SEMICONDUCTOR DEVICE INCLUDING NEUROMORPHIC DEVICE AND MANUFACTURING METHOD

(71) Applicant: SK hynix Inc., Icheon-si (KR)

(72) Inventors: Yu Bin Lee, Icheon-si (KR); Young Jae Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 297 days.

(21) Appl. No.: 18/779,730

(22) Filed: Jul. 22, 2024

(65) Prior Publication Data

US 2025/0359494 A1 Nov. 20, 2025

(30) Foreign Application Priority Data

May 16, 2024 (KR) ........................ 10-2024-0063694

(51) Int. Cl.

| | |
|---|---|
| ***H10N 70/00*** | (2023.01) |
| ***H10B 63/00*** | (2023.01) |
| ***H10N 70/20*** | (2023.01) |
| ***H10W 20/41*** | (2026.01) |

(52) U.S. Cl.

CPC ......... *H10N 70/8413* (2023.02); *H10B 63/30* (2023.02); *H10N 70/021* (2023.02); *H10N 70/253* (2023.02); *H10W 20/435* (2026.01)

(58) Field of Classification Search

CPC ............. H10N 70/8413; H10N 70/021; H10N 70/253; H10N 70/063; H10N 70/231; H10N 70/24; H10N 70/826; H10N 70/8833; H10B 63/30; H10B 63/80; H10W 20/435

See application file for complete search history.

(56) References Cited

U.S. PATENT DOCUMENTS

| | | | | |
|---|---|---|---|---|
| 2016/0380194 | A1 | 12/2016 | Karpov et al. | |
| 2017/0200768 | A1* | 7/2017 | Park | H10N 70/882 |
| 2017/0222143 | A1 | 8/2017 | Chang et al. | |
| 2020/0144500 | A1* | 5/2020 | Moon | H10B 63/24 |
| 2020/0234736 | A1* | 7/2020 | Sim | G11C 13/0002 |
| 2023/0134560 | A1* | 5/2023 | Zhong | H10B 63/30 257/4 |
| 2023/0200091 | A1* | 6/2023 | Loy | H10B 63/84 257/390 |
| 2024/0147736 | A1* | 5/2024 | Gopinath | H10B 63/30 |
| 2024/0284687 | A1* | 8/2024 | Sung | H10B 99/10 |
| 2025/0159905 | A1* | 5/2025 | Mulaosmanovic | H10B 63/10 |

OTHER PUBLICATIONS

Wei. Wu,"Improving Analog Switching in HfOx-Based Resistive Memory With a Thermal Enhanced Layer," in IEEE Electron Device Letters.

* cited by examiner

*Primary Examiner* — Mohsen Ahmadi

(57) ABSTRACT

A semiconductor device may include: a first electrode; a switching layer located on the first electrode; an oxygen reservoir layer located on the switching layer; a second electrode located on the oxygen reservoir layer; a heating electrode located on a sidewall of the switching layer; and an insulating spacer located between the heating electrode and the switching layer.

12 Claims, 9 Drawing Sheets

SEMICONDUCTOR DEVICE INCLUDING NEUROMORPHIC DEVICE AND MANUFACTURING METHOD

CROSS-REFERENCE TO RELATED APPLICATION

This application claims priority under 35 U.S.C. § 119 to Korean Patent Application No. 10-2024-0063694, filed on May 16, 2024, in the Korean Intellectual Property Office, which is incorporated herein by reference in its entirety.

BACKGROUND

1. Technical Field

Embodiments of the present disclosure relate to an electronic device, and more particularly, to a semiconductor device and a method manufacturing the semiconductor device.

2. Related Art

Recently, in accordance with miniaturization, low power consumption, performance improvement, diversification, and the like, of electronic devices, semiconductor devices capable of storing information have been demanded in various electronic devices such as computers and portable communication devices. In particular, an interest in neuromorphic technology that imitates the human nervous system has increased. The human nervous system includes hundreds of billions of neurons and synapses, which are junctions between the neurons. In the neuromorphic technology, designing neuron circuits and synapse circuits corresponding to such neurons and synapses is intended to be implemented with semiconductor devices. Semiconductor devices used in implementing the neuromorphic technology may be utilized in various fields such as data classification and pattern recognition.

SUMMARY

In an embodiment, a semiconductor device may include: a first electrode; a switching layer located on the first electrode; an oxygen reservoir layer located on the switching layer; a second electrode located on the oxygen reservoir layer; a heating electrode located on a sidewall of the switching layer; and an insulating spacer located between the heating electrode and the switching layer.

In an embodiment, a manufacturing method of a semiconductor device may include: forming a memory stack by stacking a first electrode, a switching layer, an oxygen reservoir layer, and a second electrode; forming an insulating layer along a profile of the memory stack; forming a conductive layer on the insulating layer; forming a heating electrode surrounding a sidewall of the memory stack by etching the conductive layer; and forming an insulating spacer surrounding the sidewall of the memory stack by etching the insulating layer.

DETAILED DESCRIPTION

Various embodiments are directed to semiconductor devices having a stable structure and improved characteristics and methods of manufacturing the semiconductor devices.

With the disclosed invention, it is possible to improve the linearity of synapses and improve operation characteristics of a neuromorphic device.

Hereafter, embodiments in accordance with the technical spirit of the present disclosure will be described with reference to the accompanying drawings.

Figure 1:
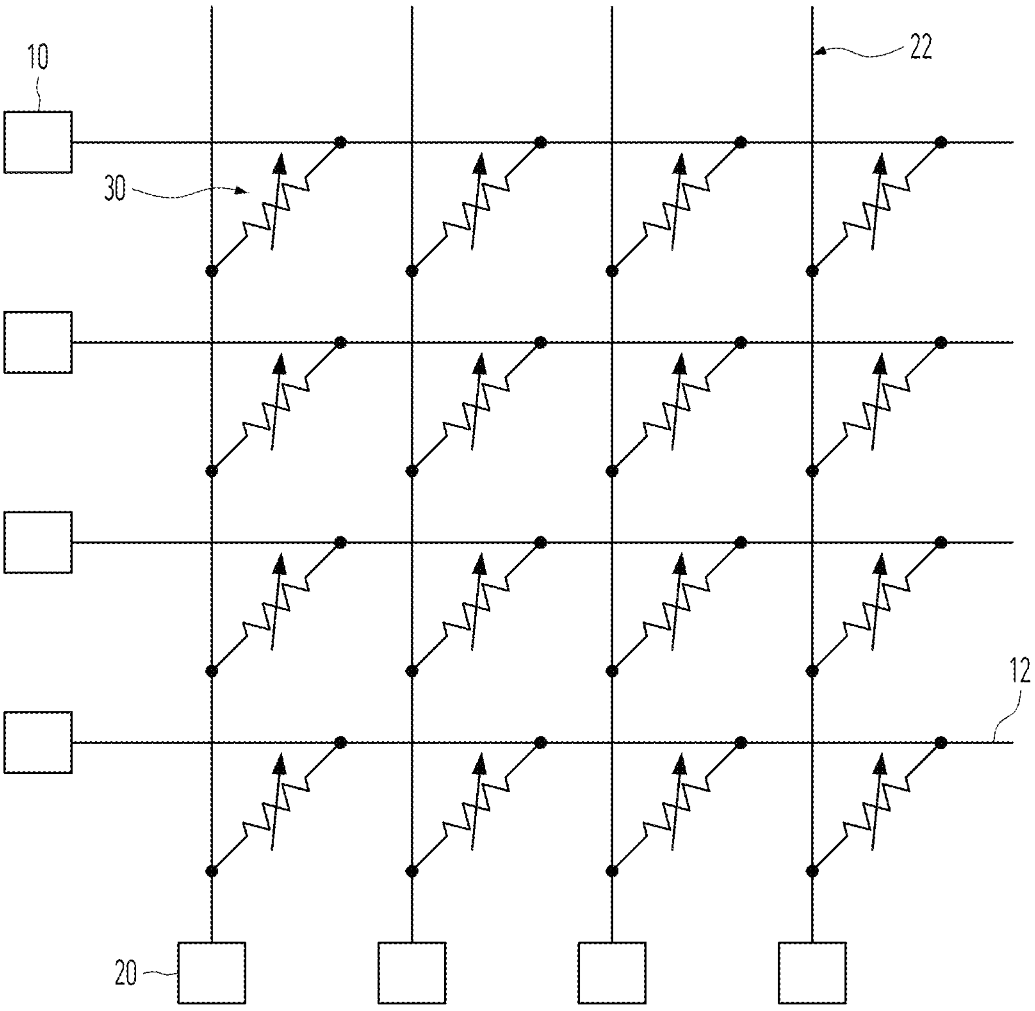
FIG. 1 is a diagram for describing a semiconductor device in accordance with an embodiment of the disclosure.

FIG. 1 is a diagram for describing a semiconductor device in accordance with an embodiment of the disclosure.

Referring to FIG. 1, a semiconductor device may be a neuromorphic device, and may include a plurality of pre-synaptic neurons 10, a plurality of post-synaptic neurons 20, and synaptic cells 30.

The semiconductor device may further include row lines 12 and column lines 22. A pre-synaptic neuron 10 and a synaptic cell 30 may be connected to each other through a row line 12, and a post-synaptic neuron 20 and a synaptic cell 30 may be connected to each other through a column line 22. The row line 12 may correspond to an axon of the pre-synaptic neuron 10, and the column line 22 may correspond to a dendrite of the post-synaptic neuron 20.

A synaptic cell 30 may be disposed at each of the intersection points between the row lines 12 and the column lines 22. A synaptic cell 30 may be connected between a pre-synaptic neuron 10 and a post-synaptic neuron 20 through a row line 12 and a column line 22.

The pre-synaptic neuron 10 may generate a signal corresponding to specific data and transmit the generated signal to the row line 12. The post-synaptic neuron 20 may receive and process a synaptic signal that has passed through the synaptic cell 30, via the column line 22. The pre-synaptic neuron 10 and the post-synaptic neuron 20 may be implemented with various circuits such as complementary metal oxide semiconductors (CMOSs), as a non-limiting example.

The synaptic cell 30 is an element whose electrical conductance or weight changes depending on an electrical pulse such as a voltage or a current applied to both of its ends. As an example, the synaptic cell 30 may be a variable resistance element or a resistive memory cell. The variable resistance element may switch between different resistance states depending on a voltage or a current applied to both of its ends. The variable resistance element may include a switching layer that may have a plurality of resistance states. The switching layer may be a resistive switching layer. For example, the switching layer may include metal oxide such as transition metal oxide and a perovskite-based material, a phase change material such as a chalcogenide-based material, a ferroelectric material, a ferromagnetic material, and the like.

The synaptic cell 30 may change from a high-resistance state to a low-resistance state through a set operation, and may change from a low-resistance state to a high-resistance state through a reset operation. A weight for a synaptic state may be stored in the synaptic cell 30 through the set/reset operation. In order to store an accurate weight, the synaptic cell 30 may have analog characteristics in that resistance changes in proportion to an applied voltage without undergoing an abrupt change in resistance during the set/reset operation. Through such analog characteristics, conductance (i.e., the weight of the synaptic cell 30) may be changed, and matrix product computing, which is a process of multiplying an external input voltage by the weight, may be performed.

Figure 2A:
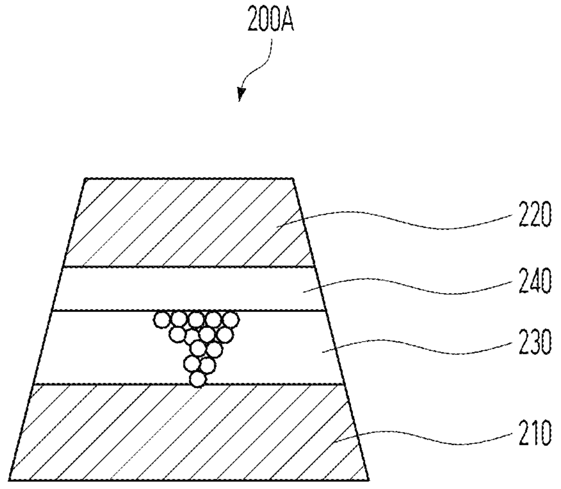
FIGS. 2A and 2B are diagrams illustrating a configuration of a semiconductor device in accordance with an embodiment of the disclosure.
Figure 2B:
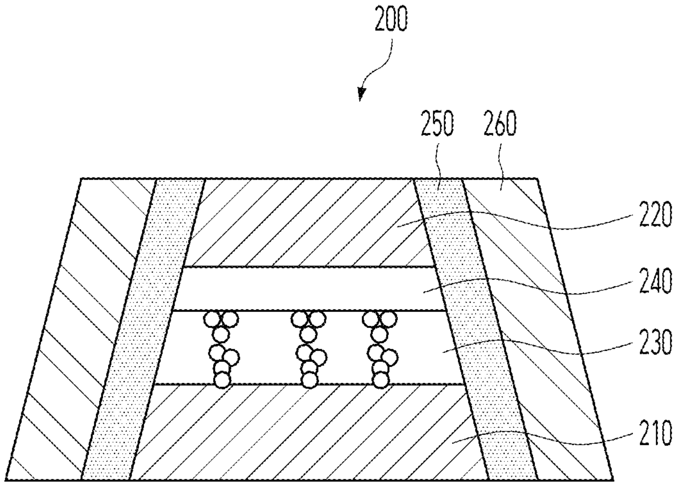

FIGS. 2A and 2B are diagrams illustrating a configuration of a semiconductor device in accordance with an embodiment. Hereinafter, content that overlaps with previously described content may be omitted from the description for clarity.

Referring to FIG. 2A, a resistive memory cell 200A may include a first electrode 210, a second electrode 220, a switching layer 230, and an oxygen reservoir layer 240. The switching layer 230 may be located between the first electrode 210 and the second electrode 220, and the oxygen reservoir layer 240 may be located between the switching layer 230 and the second electrode 220.

The switching layer 230 may have variable resistance characteristics in which the switching layer exhibits different resistance states depending on a voltage or a current supplied through the first electrode 210 and the second electrode 220. As an example, the switching layer 230 may have analog characteristics in that its resistance variably changes depending on the degree to which a conductive filament is generated. The filament electrically connects the first electrode 210 and the second electrode 220 to each other, and may be generated, partially generated, or may dissipate according to the movement of oxygen vacancies. Here, the oxygen vacancy may be a lattice defect occurring when oxygen escapes from a location to which oxygen should be bonded, and the lattice defect may exhibit the same behavior as a particle having a positive charge, such as a hole. When the oxygen vacancies are connected to each other, a filament may be generated, and when the oxygen vacancies are disconnected from each other, the filament may disappear. The switching layer 230 may include metal oxide, and metal included in the switching layer 230 may be transition metal. As an example, the switching layer 230 may include metal such as Al, Si, Ti, Cr, Mn, Ni, Cu, Zn, Y, Zr, Nb, Hf, Ta, or W. The switching layer 230 may include $HfO_2$, $TiO_2$, $Al_2O_3$, $ZrO_2$, or the like.

The oxygen reservoir layer 240 may include and reserve the oxygen vacancies necessary for the generation of the filament and may receive oxygen vacancies. During resistance switching driving of the resistive memory cell 200A, oxygen ions and/or the oxygen vacancies may be exchanged between the switching layer 230 and the oxygen reservoir layer 240. As an example, during a set operation, a filament may be generated in the switching layer 230 by the oxygen vacancies supplied from the oxygen reservoir layer 240, and resistance of the switching layer 230 may decrease as a result. During a reset operation, the oxygen vacancies of the filament may be transferred to the oxygen reservoir layer 240, such that the filament may dissipate and the resistance of the switching layer 230 may increase. The oxygen reservoir layer 240 may include metal or metal oxide. As an example, the oxygen reservoir layer 240 may include Ti, Ta, Hf, or the like.

Referring to FIG. 2B, a resistive memory cell 200 may include a first electrode 210, a second electrode 220, a switching layer 230, an oxygen reservoir layer 240, an insulating spacer 250, and a heating electrode 260. The heating electrode 260 may be located on a sidewall of the insulating spacer 250, and may extend along the sidewall of the insulating spacer 250. As an example, the heating electrode 260 may be located common to sidewalls of the first electrode 210, the second electrode 220, the switching layer 230, and the oxygen reservoir layer 240, with the insulating spacer 250 located between the heating electrode 260 and the sidewall of switching layer 230. The insulating spacer 250 may also extend between sidewalls of the first electrode 210 and the heating electrode 260, between sidewalls of the oxygen reservoir layer 240 and the heating electrode 260, and between sidewalls of the second electrode 220 and the heating electrode 260.

The heating electrode 260 may be an electrode for generating heat by Joule heating. The heat generated from the heating electrode 260 may be transferred to the switching layer 230 through the insulating spacer 250. The transferred heat may affect the generation of filaments in the switching layer 230. Referring to FIG. 2A, because the resistive memory cell 200A does not include a heating electrode, the mobility of the oxygen vacancies is relatively low, and the oxygen vacancies gather at a local location in the switching layer 230. The oxygen vacancies are connected to each other, such that a single strong filament is generated in the switching layer 230, and the resistance of the switching layer 230 is more abruptly changed. Accordingly, analog characteristics of the resistive memory cell 200A deteriorate, and it is difficult to store an accurate synaptic weight in the resistive memory cell 200A. Referring to FIG. 2B, because the resistive memory cell 200 includes the heating electrode 260, heat may be transferred to the switching layer 230. Oxygen vacancies may be activated by the transferred heat, and heat activated oxygen vacancies may be uniformly distributed in the switching layer 230. The uniformly distributed oxygen vacancies may be connected to each other, such that multiple weak filaments may be generated in the switching layer 230. Accordingly, resistance of the switching layer 230 may be more gradually changed.

According to the structure described above, heat may be transferred to the switching layer 230 through the heating electrode 260, and the resistive memory cell 200 may have analog characteristics. Accordingly, it is possible to provide a resistive memory cell 200 suitable for an analog computing in memory (ACiM).

Figure 3A:
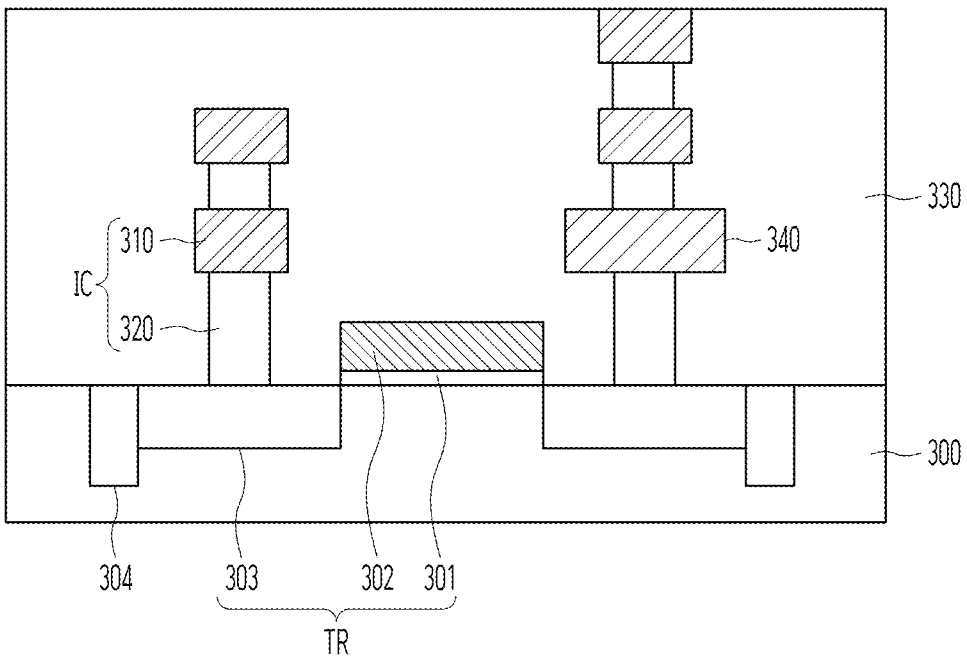
FIGS. 3A and 3B are diagrams illustrating a structure of a semiconductor device in accordance with an embodiment.
Figure 3B:
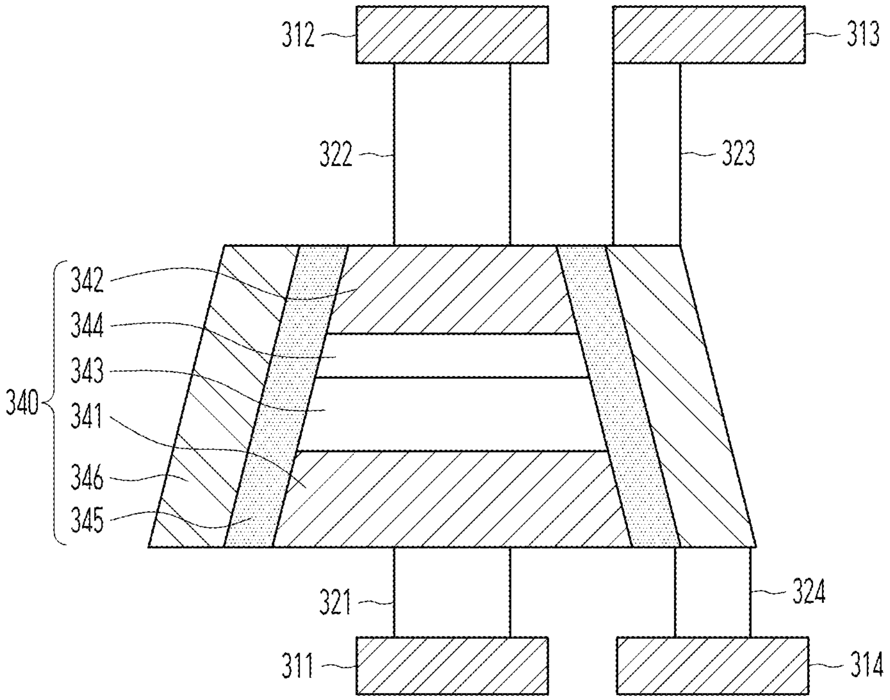

FIGS. 3A and 3B are diagrams illustrating a structure of a semiconductor device in accordance with an embodiment of the disclosure. FIG. 3B may be an enlarged view of a resistive memory cell 340 of FIG. 3A. Hereinafter, content that overlaps with previously described content may be omitted for clarity.

Referring to FIG. 3A, a semiconductor device may include a substrate 300, a resistive memory cell 340, a transistor TR, an element isolation layer 304, an interconnection structure IC, and an interlayer insulating layer 330. The transistor TR may be a switching element of the resistive memory cell 340. The element isolation layer 304 may be located in the substrate 300, and the transistor TR may be located in an active region defined by the element isolation layer 304. The transistor TR may include a gate insulating layer 301, a gate electrode 302, and a junction 303. The switching element is not limited to the transistor TR, and may be a diode, a bipolar junction transistor, or the like.

The interconnection structure IC may be connected to the junction 303 and/or the gate electrode 302 of the transistor TR. The interconnection structure IC may be located in the interlayer insulating layer 330, and may include a contact plug 320 and a wiring line 310. The contact plug 320 and the wiring line 310 may be arranged in multiple layers. The resistive memory cell 340 may be connected to the transistor TR through the interconnection structure IC. In FIG. 3A, one contact plug 320 connected to each of an upper portion and a lower portion of the resistive memory cell 340 has been illustrated for reference, but in other embodiments a plurality of contact plugs 320 may be connected to each of the upper portion and the lower portion of a resistive memory cell 340.

Referring to FIG. 3B, a resistive memory cell 340 may include a first electrode 341, a second electrode 342, a switching layer 343, an oxygen reservoir layer 344, an insulating spacer 345, and a heating electrode 346. The insulating spacer 345 may be located on sidewalls of the first electrode 341, the second electrode 342, the switching layer 343, and the oxygen reservoir layer 344. The heating electrode 346 may be located on a sidewall of the insulating spacer 345.

A first wiring line 311 and a first contact plug 321 may be connected to the first electrode 341. A second contact plug 322 and a second wiring line 312 may be connected to the second electrode 342. During an operation of the resistive memory cell 340, a current may flow through the second wiring line 312, the second contact plug 322, the resistive memory cell 340, the first contact plug 321, and the first wiring line 311.

A third contact plug 323, a third wiring line 313, a fourth contact plug 324, and a fourth wiring line 314 may be connected to the heating electrode 346. During a switching operation of the resistive memory cell 340, a voltage may be applied to the heating electrode 346. As an example, a voltage may be applied to the heating electrode 346 only during a set operation, and may be optionally applied to the heating electrode 346 during a reset operation. When a heating voltage is applied to the heating electrode 346 during the set operation, a current may flow through the third wiring line 313, the third contact plug 323, the heating electrode 346, the fourth contact plug 324, and the fourth wiring line 314. Here, a path through which the current flows through the heating electrode 346 and a path through which the current flows through the resistive memory cell 340 may be separated from each other by the insulating spacer 345.

A resistive memory cell 340 with a structure as described above may be connected to the transistor TR. The third wiring line 313 may be connected to the heating electrode 346, and the heating voltage may be applied to the heating electrode 346 through the third wiring line 313 and the third contact plug 323. Accordingly, the heating electrode 346 may generate heat, and may transfer the generated heat to the switching layer 343.

Figure 4:
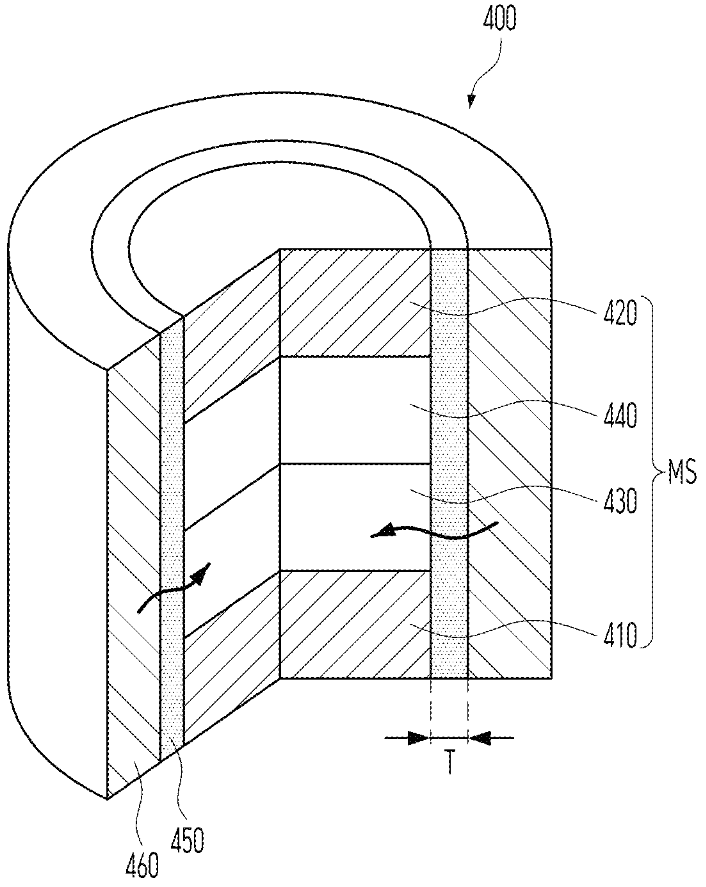
FIG. 4 is a diagram illustrating a structure of a semiconductor device in accordance with an embodiment of the disclosure.

FIG. 4 is a diagram illustrating a structure of a semiconductor device in accordance with an embodiment of the disclosure. Hereinafter, content that overlaps with previously described content may be omitted.

Referring to FIG. 4, a resistive memory cell 400 may include a first electrode 410, a second electrode 420, a switching layer 430, an oxygen reservoir layer 440, an insulating spacer 450, and a heating electrode 460.

The switching layer 430, the oxygen reservoir layer 440, and the second electrode 420 may be stacked on the first electrode 410. The stacked first electrode 410, switching layer 430, oxygen reservoir layer 440, and second electrode 420 may constitute a memory stack MS, and the memory stack MS may have a shape such as a circular shape, an elliptical shape, or a polygonal shape in a plan view.

The insulating spacer 450 may surround a sidewall of the switching layer 430. The insulating spacer 450 may surround a sidewall of the oxygen reservoir layer 440, a sidewall of the first electrode 410, and a sidewall of the second electrode 420.

The insulating spacer 450 is used to insulate the memory stack and the heating electrode 460 from each other, and may include an insulating material such as silicon oxide or silicon nitride. Because heat generated from the heating electrode 460 is transferred to the switching layer 430 through the insulating spacer 450, the insulating spacer 450 may have a thickness T suitable for heat transfer and may be formed of a material suitable for heat transfer. The insulating spacer 450 may have a smaller thickness than the heating electrode 460. However, when the thickness of the insulating spacer 450 is excessively small, current may flow from the heating electrode 460 to the memory stack MS by direct tunneling. Accordingly, the thickness T of the insulating spacer 450 may be set to exceed a minimum predetermined value so that an electrical reaction such as the direct tunneling does not occur. In addition, the insulating spacer 450 may be formed of a material having low electrical conductance and high thermal conductivity. When the insulating spacer 450 is formed of a material having high thermal conductivity, it is thus possible to minimize heat loss when the heat is transferred from the heating electrode 460 to the switching layer 430.

The heating electrode 460 is used to generate heat by Joule heating, and may include metal or include a material having high resistance, such as titanium nitride. The heating electrode 460 may surround the insulating spacer 450, thereby surrounding or covering the sidewall of the first electrode 410, the sidewall of the switching layer 430, the sidewall of the oxygen reservoir layer 440, and the sidewall of the second electrode 420. The heating electrode 460 may entirely or only partially surround a sidewall of the memory stack MS. When the heating electrode 460 entirely surrounds the sidewall of the memory stack MS, for example, encircles from a plan view the sidewall of the memory stack MS by 360°, the heat generated from the heating electrode 460 may be efficiently transferred to the switching layer 430.

According to the structure described above, a heating voltage may be applied to the heating electrode 460 during a set operation, and heat generated from the heating electrode 460 may be transferred to the switching layer 430 through the insulating spacer 450. Here, the heating voltage may have the same polarity as a set voltage, and may have a higher voltage level than the set voltage. The heating voltage might not be applied to the heating electrode 460 during a reset operation.

Figure 5A:
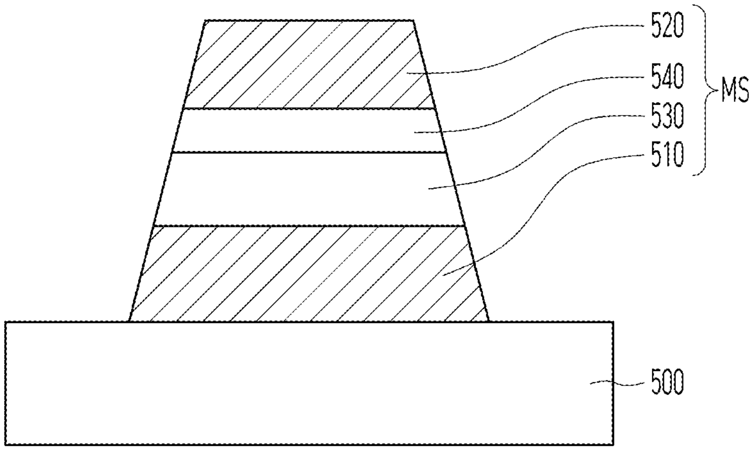
FIGS. 5A to 5C are diagrams for describing a manufacturing method for a semiconductor device in accordance with an embodiment of the disclosure.
Figure 5B:
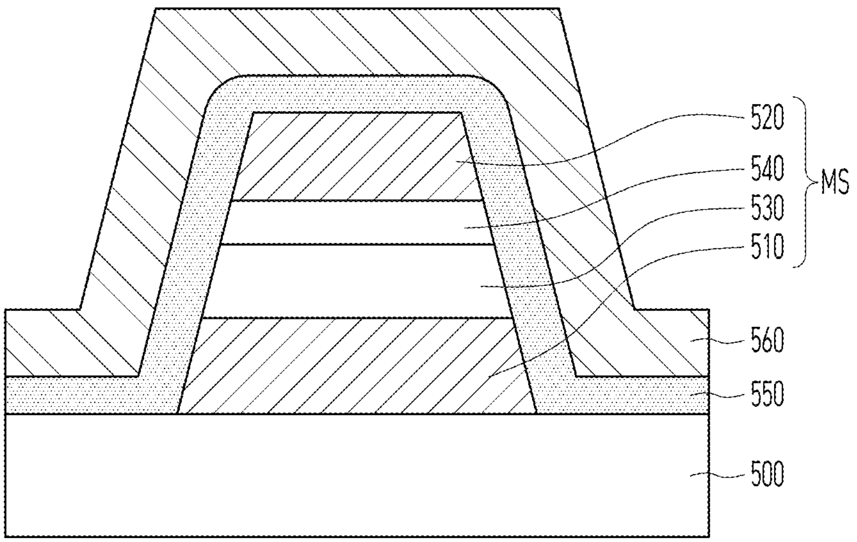
Figure 5C:
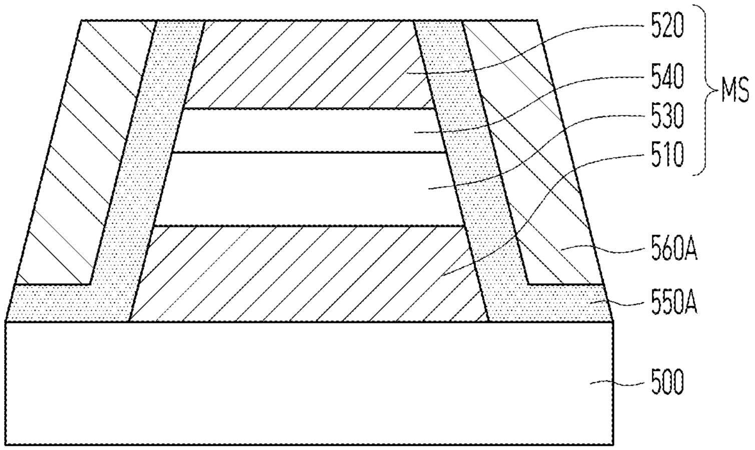

FIGS. 5A to 5C are diagrams for describing a manufacturing method for a semiconductor device in accordance with an embodiment of the disclosure. Hereinafter, content that overlaps with previously described content may be omitted for clarity.

Referring to FIG. 5A, a memory stack MS may be formed on a base 500. The base 500 may include lower structures (not illustrated) such as a substrate, a transistor, an interconnection structure, and an interlayer insulating layer. The memory stack MS may include a first electrode 510, a switching layer 530, an oxygen reservoir layer 540, and a second electrode layer 520. As an example, the memory stack MS may be formed by sequentially stacking a first electrode layer, a switching layer, an oxygen reservoir layer, and a second electrode layer on the base 500 and then etching the stacked layers. Depending on physical properties of the stacked layers, etching conditions, and the like, a sidewall of the memory stack MS may have a vertical profile or an inclined profile. The memory stack MS may have a line shape in which it extends in one direction parallel to a surface of the base 500. Alternatively, the memory stack MS may have an island shape from a plan view, and a plurality of memory stacks MS may be arranged in a matrix shape from a plan view.

Referring to FIG. 5B, an insulating layer 550 may be formed on the memory stack MS. As an example, the insulating layer 550 may be formed along a profile of the memory stack MS using a deposition method such as atomic layer deposition (ALD). The insulating layer 550 may be formed along an inclined sidewall of the memory stack MS. Subsequently, a conductive layer 560 may be formed on the insulating layer 550. As an example, the conductive layer 560 may be formed along a profile of the insulating layer 550 using a deposition method such as ALD. The conductive layer 560 may be formed along the inclined sidewall of the memory stack MS. The conductive layer 560 may include metal.

Referring to FIG. 5C, a heating electrode 560A and an insulating spacer 550A may be formed by etching the conductive layer 560 and the insulating layer 550. The conductive layer 560 formed on an upper surface of the memory stack MS and a surface of the base 500 may be removed through an etching process, and the conductive layer 560 remaining on the sidewall of the memory stack MS may be the heating electrode 560A. The insulating layer 550 formed on the upper surface of the memory stack MS and the surface of the base 500 may be removed through the etching process, and the insulating layer 550 remaining on the sidewall of the memory stack MS may be the insulating spacer 550A. Through this, a resistive memory cell including the first electrode 510, the switching layer 530, the oxygen reservoir layer 540, the second electrode 520, the insulating spacer 550A, and the heating electrode 560A may be formed.

According to the manufacturing method described above, the heating electrode 560A may be formed to surround or cover the sidewalls of the memory stack MS. Accordingly, it is possible to form a resistive memory cell in which heat is transferred to the switching layer 530 from the heating electrode 560A through the insulating spacer 550A.

Although embodiments according to the technical idea of the present disclosure have been described above with reference to the accompanying drawings, this is only for explaining embodiments according to the concepts of the present disclosure, and the present disclosure is not limited to the above embodiments. Various types of substitutions, modifications, changes, and combinations for the embodiments may be made by those skilled in the art, to which the present disclosure pertains, without departing from the technical idea of the present disclosure defined in the following claims, and it should be construed that these substitutions, modifications, changes, and combinations belong to the scope of the present disclosure.

What is claimed is:

1. A semiconductor device comprising:
- a first electrode;
- a switching layer located on the first electrode;
- an oxygen reservoir layer located on the switching layer;
- a second electrode located on the oxygen reservoir layer;
- a heating electrode located on a sidewall of the switching layer;
- an insulating spacer located between the heating electrode and the switching layer;
- a first wiring line connected to the first electrode;
- a second wiring line connected to the second electrode; and
- a third wiring line connected to the heating electrode and electrically separated from the first wiring line and the second wiring line,
- wherein the heating electrode is heated by Joule heating when a heating voltage is applied to the heating electrode through the third wiring line.

2. The semiconductor device of claim 1, wherein the insulating spacer extends to a sidewall of the oxygen reservoir layer, a sidewall of the first electrode, and a sidewall of the second electrode.

3. The semiconductor device of claim 1, wherein the heating electrode surrounds a sidewall of the switching layer.

4. The semiconductor device of claim 1, wherein the switching layer is heated by heat from the heating electrode through the insulating spacer.

5. The semiconductor device of claim 1, wherein the heating electrode is heated during a set operation.

6. The semiconductor device of claim 1, further comprising multiple conductive filaments in the switching layer during a set operation in which voltage is applied through the first electrode and the second electrode.

7. The semiconductor device of claim 1, wherein the switching layer includes an inclined sidewall, and the heating electrode is disposed along the inclined sidewall.

8. The semiconductor device of claim 1, wherein the insulating spacer includes silicon oxide or silicon nitride.

9. The semiconductor device of claim 1, wherein the heating electrode includes titanium nitride.

10. A manufacturing method of a semiconductor device, the manufacturing method comprising:
- forming a memory stack by stacking a first electrode, a switching layer, an oxygen reservoir layer, and a second electrode;
- forming an insulating layer along a profile of the memory stack;
- forming a conductive layer on the insulating layer;
- forming a heating electrode surrounding a sidewall of the memory stack by etching the conductive layer;
- forming an insulating spacer surrounding the sidewall of the memory stack by etching the insulating layer; and
- forming a wiring line connected to the heating electrode,
- wherein the memory stack includes an inclined sidewall, and the heating electrode is formed along the inclined sidewall.

11. The manufacturing method of claim 10, wherein the insulating spacer includes silicon oxide or silicon nitride.

12. The manufacturing method of claim 10, wherein the heating electrode includes titanium nitride.

* * * * *